(12) United States Patent
Jeon et al.

(10) Patent No.: US 10,396,095 B2
(45) Date of Patent: Aug. 27, 2019

(54) SEMICONDUCTOR DEVICE AND MANUFACTURING METHOD THEREOF

(71) Applicant: SK hynix Inc., Gyeonggi-do (KR)

(72) Inventors: Jong Sung Jeon, Gyeonggi-do (KR); Eun Mee Kwon, Gyeonggi-do (KR); Da Som Lee, Seoul (KR); Bong Hoon Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/027,873

(22) Filed: Jul. 5, 2018

(65) Prior Publication Data

US 2019/0115364 A1 Apr. 18, 2019

(30) Foreign Application Priority Data

Oct. 13, 2017 (KR) .......................... 10-2017-0133244

(51) Int. Cl.
| | |
|---|---|
| *H01L 27/115* | (2017.01) |
| *H01L 27/11582* | (2017.01) |
| *H01L 27/11556* | (2017.01) |
| *H01L 29/78* | (2006.01) |
| *H01L 29/792* | (2006.01) |
| *H01L 27/1157* | (2017.01) |
| *G11C 16/30* | (2006.01) |
| *H01L 27/06* | (2006.01) |
| *G11C 16/14* | (2006.01) |
| *H01L 27/11568* | (2017.01) |

(52) U.S. Cl.
CPC ........ *H01L 27/11582* (2013.01); *G11C 16/14* (2013.01); *G11C 16/30* (2013.01); *H01L 27/0688* (2013.01); *H01L 27/1157* (2013.01); *H01L 27/11556* (2013.01); *H01L 27/11568* (2013.01); *H01L 29/7827* (2013.01); *H01L 29/7926* (2013.01)

(58) Field of Classification Search
None
See application file for complete search history.

(56) References Cited

U.S. PATENT DOCUMENTS

| | | | | |
|---|---|---|---|---|
| 2008/0073704 | A1* | 3/2008 | Yasuda | ............. H01L 21/28282 257/324 |
| 2015/0097222 | A1* | 4/2015 | Lee | ..................... H01L 27/1157 257/314 |
| 2015/0221667 | A1* | 8/2015 | Fukuzumi | ......... H01L 27/11582 257/314 |
| 2017/0033121 | A1* | 2/2017 | Miyamoto | ........ H01L 27/11524 |
| 2017/0358356 | A1* | 12/2017 | Lee | ......................... H01L 29/16 |

(Continued)

FOREIGN PATENT DOCUMENTS

| | | |
|---|---|---|
| KR | 1020110130257 | 12/2011 |
| KR | 1020140026148 | 3/2014 |

(Continued)

*Primary Examiner* — Evren Seven
(74) *Attorney, Agent, or Firm* — IP & T Group LLP

(57) ABSTRACT

A semiconductor device includes: hole source patterns; electron source patterns located between adjacent hole source patterns; a stack structure over the hole source patterns and the electron source patterns; and channel layers penetrating the stack structure, wherein each channel layer is in contact with a corresponding hole source pattern and an electron source pattern adjacent to the corresponding hole source pattern.

19 Claims, 14 Drawing Sheets

(56) References Cited

U.S. PATENT DOCUMENTS

2017/0358362 A1* 12/2017 Lee .................... G11C 16/0466
2018/0061701 A1*  3/2018 Miyano ............. H01L 27/11575
2018/0358365 A1* 12/2018 Lee ................... H01L 27/11582

FOREIGN PATENT DOCUMENTS

KR   1020140078233   6/2014
KR   1020160110906   9/2016

\* cited by examiner

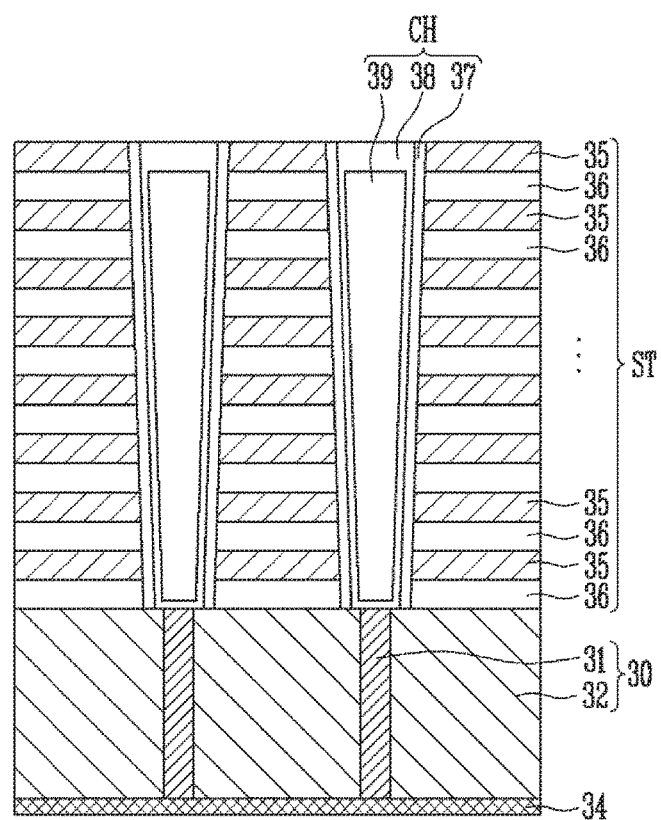

SEMICONDUCTOR DEVICE AND MANUFACTURING METHOD THEREOF

CROSS-REFERENCE TO RELATED APPLICATION

The present application claims priority under 35 U.S.C. § 119(a) to Korean Patent Application No. 10-2017-0133244, filed on Oct. 13, 2017, which is incorporated herein by reference in its entirety.

BACKGROUND

1. Field of Invention

The present disclosure relates generally to an electronic device, and more particularly, to a semiconductor device and a manufacturing method thereof.

2. Description of the Related Art

A nonvolatile memory device retain stored data even when the power supply to the device is cut off. Recently, as improvements in the degree of integration of two-dimensional nonvolatile memory devices in which memory cells are formed in a single layer on a substrate have reached an upper limit, three-dimensional nonvolatile memory devices are being proposed in which memory cells are vertically stacked in multiple layers on a substrate.

Typically, a three-dimensional nonvolatile memory device includes a plurality of interlayer insulating layers and gate electrodes, which are alternately stacked, and channel layers penetrating the interlayer insulating layers and the gate electrodes. Memory cells are stacked along the channel layers. Various structures and manufacturing methods have been developed for improving the operational reliability of the three-dimensional non-volatile memory device.

SUMMARY

Various embodiments of the present invention provide a semiconductor device that facilitates a manufacturing process and has a stable structure and improved characteristics, and a manufacturing method of the semiconductor device.

According to an aspect of the present disclosure, there is provided a semiconductor device including: hole source patterns; electron source patterns located between adjacent hole source patterns; a stack structure over the hole source patterns and the electron source patterns; and channel layers penetrating the stack structure, wherein each channel layer is in contact with a corresponding hole source pattern and an electron source pattern adjacent to the corresponding hole source pattern.

According to another aspect of the present disclosure, there is provided a semiconductor device including: hole source patterns and electron source patterns alternately arranged; a stack structure formed over the hole source patterns and the electron source patterns; and channel layers penetrating the stack structure, each channel layer being in common contact with a hole source pattern and an electron source pattern adjacent to the hole source pattern, wherein holes are supplied from the hole source patterns to the channel layers in an erase operation, and current flows to the electron source patterns from a selected channel layer among the channel layers in a read operation.

According to yet another aspect of the present disclosure, there is provided a method of manufacturing a semiconductor device, the method including: forming hole source patterns and electron source patterns located between the hole source patterns; forming a stack structure over the hole source patterns and the electron source patterns, the stack structure including first material layers and second material layers that are alternately stacked; and forming channel layers penetrating the stack structure, the channel layers being in common contact with adjacent hole source pattern and electron source pattern.

According to yet another aspect of the present disclosure, there is provided a semiconductor device including: a stack structure formed of a plurality of insulating and conductive layers alternately stacked along a third direction vertical to a plane defined by a first and a second direction, each insulating layer and each conductive layer extending in the first and the second direction; hole source patterns and electron source patterns alternately formed along the second direction; and channel layers penetrating the stack structure to expose and contact the hole source patterns and the electron source patterns, wherein each channel layer is in contact with a corresponding hole source pattern and two electron source patterns that are adjacent on either side of the hole source pattern, and wherein each hole source pattern is electrically isolated from adjacent electron source patterns via a barrier pattern.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 2A to 2C are views illustrating a structure of a semiconductor device in accordance with an embodiment of the present disclosure.

DETAILED DESCRIPTION

Figure 1A:
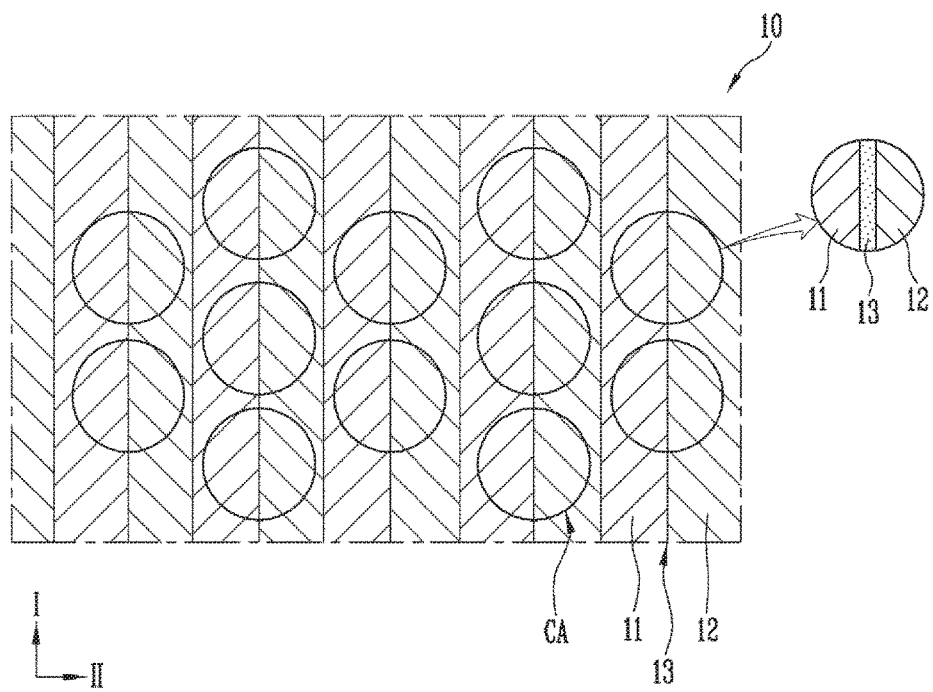
FIGS. 1A to 1C are views illustrating a structure of a semiconductor device in accordance with an embodiment of the present disclosure.

Example embodiments of the present disclosure will be described with reference to the accompanying drawings. The example embodiments of the present disclosure may, however, be embodied in many different forms and should not be construed as limited to the example embodiments set forth herein. Rather, the example embodiments are provided so that disclosure of the present disclosure will be thorough and complete, and will fully convey the scope of the present disclosure to those skilled in the art. The features of example embodiments of the present disclosure may be employed in various and numerous embodiments without departing from the scope of the present disclosure. In the drawings, the size and relative sizes of layers and areas may be exaggerated for clarity. The drawings are not to scale. Like reference numerals refer to like elements throughout.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless clearly stated otherwise.

Figure 1B:
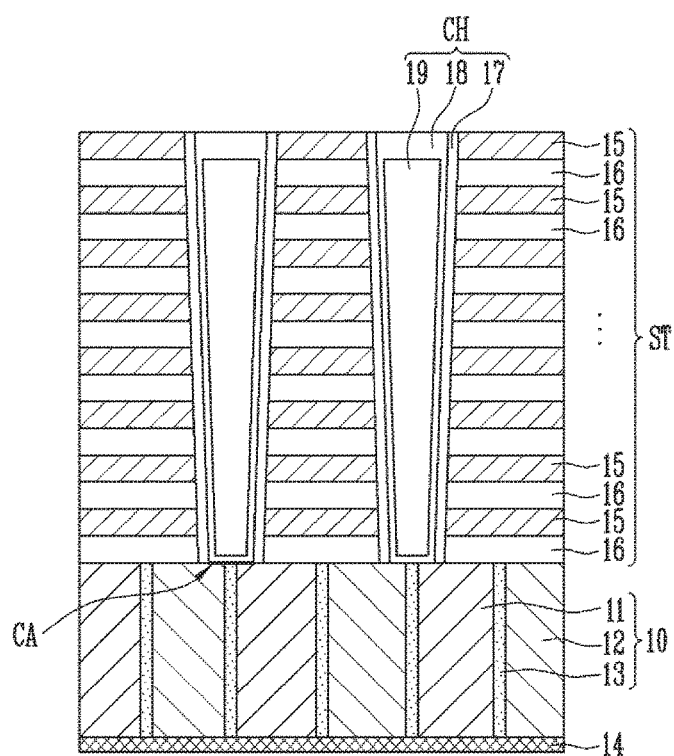
Figure 1C:
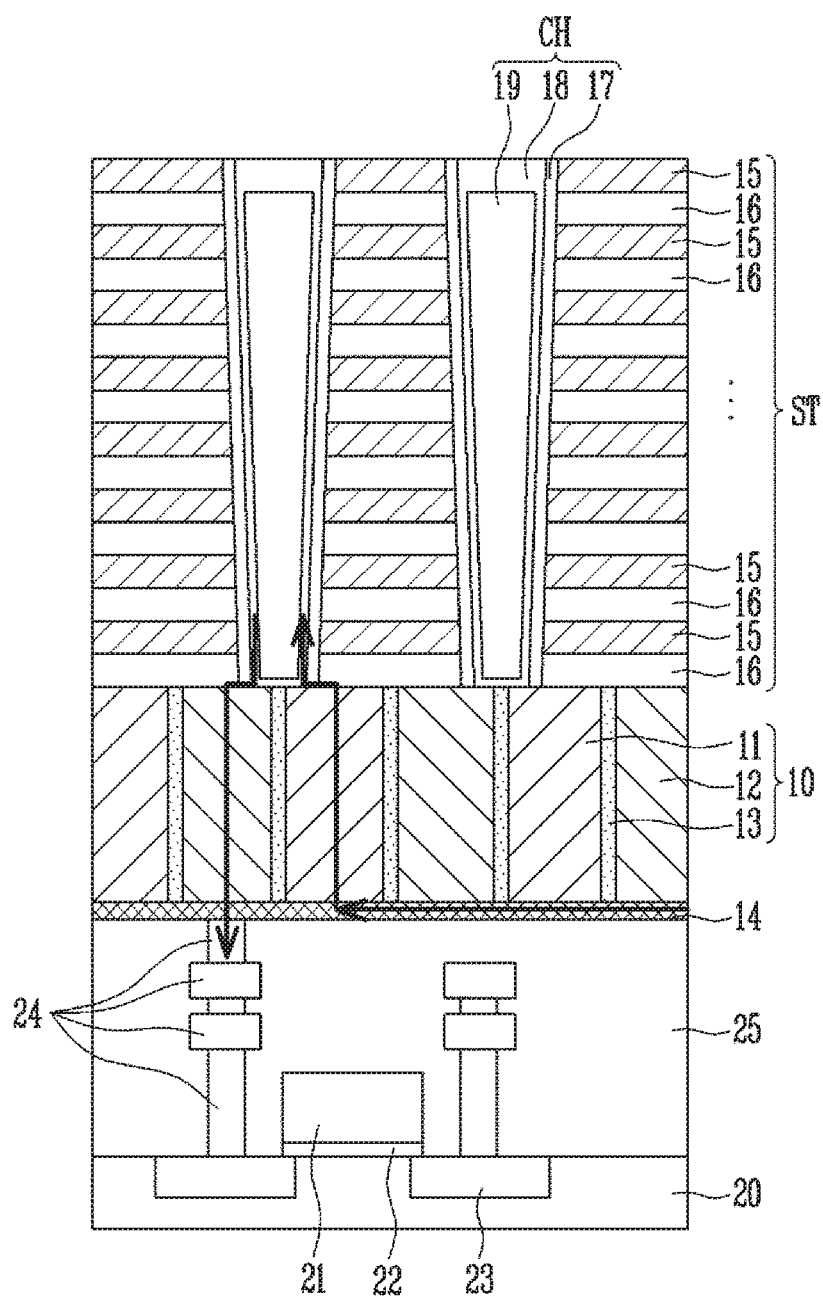

FIGS. 1A to 1C are views illustrating a structure of a semiconductor device according to an embodiment of the present disclosure. FIG. 1A is a layout, and FIGS. 1B and 1C are sectional views.

Referring to FIGS. 1A and 1B, the semiconductor device may include hole source patterns 11, electron source patterns 12, barrier patterns 13, a stack structure ST, a channel structure CH, and a connection layer 14. The semiconductor device may be a semiconductor memory device, such as a NAND flash memory device.

The hole source patterns 11 are hole sources for supplying holes to a memory cell in an erase operation, and may include an impurity of a first type. For example, the first type may be a P type, and the hole source patterns 11 may be poly-silicon layers including an impurity of the P type.

The electron source patterns 12 are electron sources for supplying electrons to a channel layer in a read operation, and may include an impurity of a second type different from the first type. For example, the second type may be an N type, and the electron source patterns 12 may be poly-silicon layers including an N-type impurity.

Here, the hole source patterns 11 may have a line shape extending in a first direction I. In addition, the electron source patterns 12 are located between the hole source patterns 11 adjacent to each other, and may also have a line shape extending in the first direction I. Therefore, the hole source patterns 11 and the electron source patterns 12 may be alternately arranged along a second direction II intersecting the first direction I.

The barrier patterns 13 may be interposed between the hole source patterns 11 and the electron source patterns 12. The barrier patterns 13 prevent the impurity of the first type, which is included in a hole source pattern 11, and the impurity of a second type, which included in an adjacent electron source pattern 12, from being mixed together. The hole source patterns 11 and the electron source patterns 12 can be electrically isolated from each other via the barrier patterns. For example, the barrier patterns 13 may have a spacer shape, and be made of or include a dielectric material such as oxide or nitride. The width (or thickness) of the barrier patterns 13 in the second direction II may vary by design but may each have a much smaller width than the hole source and the electron source patters 11 and 12.

Here, the hole source patterns 11 and the electron source patterns 12 may have line shapes extending in the first direction I, and the barrier patterns 13 may be interposed between the hole source patterns 11 and the electron source patterns 12, which are adjacent to each other. Therefore, the barrier patterns 13 may also have a line shape extending in the first direction I. In this case, the hole source pattern 11, the barrier pattern 13, the electron source pattern 12, and the barrier pattern 13 may be sequentially arranged in the second direction II, and such an arrangement may be repeated.

In addition, the hole source patterns 11, the electron source patterns 12, and the barrier patterns 13 are located at the same level, and constitute first substrate 10. Here, the hole source patterns 11 and the electron source patterns 12 may be layers formed through separate processes. In this case, an interface between the hole source patterns 11 and the electron source patterns 12 may exist. Alternatively, the hole source patterns 11 and the electron source patterns 12 may be formed as one layer, and may each be defined as a region doped with a respective impurity.

Connection layer 14 is located under the hole source patterns 11 and the electron source patterns 12, and is in common contact with the hole source patterns 11 and the electron source patterns 12. For example, an upper surface of the connection layer 14 is in direct contact with bottom surfaces of the hole source patterns 11 and the electron source patterns 12. Here, the connection layer 14 may be used as a path through which an erase bias can be transferred in an erase operation or be used as a current path in a read operation. For example, the connection layer 14 may be a conductive layer made of or including poly-con, metal, and the like.

The stack structure ST may include first and second material layers 15 and 16 which are alternately stacked. The first material layers 15 may be conductive layers. The second material layers 16 may be insulating layers. For example, at least one first material layer 15 at the uppermost portion of the stack structure ST may be a gate electrode of an upper select transistor, at least one first material layer 15 at the lowermost portion of the stack structure ST may be a gate electrode of a lower select transistor, and the other material layers 15 may be gate electrodes of memory cells. Hence, at least one lower select transistor, a plurality of memory cells, and at least one upper select transistor may be connected in series, to constitute a memory string.

A plurality of channel structures CH may be arranged in rows and columns along the first direction I and the second direction II. Each channel structure CH may extend in a third direction penetrating through the stack structure ST. In addition, the centers of adjacent channel structures CH may be offset in the first direction I or the second direction II, resulting in a staggered form arrangement. Each of the channel structures CH may be spaced apart from its adjacent channel structures. CH. Each channel structure CH may include a memory layer 17, a channel layer 18, and a gap-fill layer 19. The memory layer 17 may include at least one of a tunnel insulating layer, a data storage layer, and a charge blocking layer which are all well-known in the art, hence, detailed description thereof is herein omitted. For example, the data storage layer may include a floating gate, a charge storage material, a charge trapping material, a phase change material, a variable resistance material, nanodots, and the like. The channel layer 18 is a region in which a channel of a select transistor, a memory cell, or the like is formed, and may be a semiconductor layer made of or including silicon (Si), germanium (Ge), and the like. The channel layer 18 may have a structure in which it is filled even at the center thereof, or have a tubular structure in which its central portion is opened. The gap-fill layer 19 may be filled in the opened central portion of the channel layer 18.

Each of the channel layers 18 is in common contact with at least one hole source pattern 11 and at least one electron source pattern 12. For example, each of the channel layers 18 is in common contact with the hole source pattern 11 and the electron source pattern 12, which are adjacent to each other. A connection region CA shown in FIG. 1A shows a section in which the channel layer 18 is in contact with the hole source pattern 11 and the electron source pattern 12, and it can be seen that a bottom surface of the channel layer 18 is in common contact with the hole source pattern 11 and the electron source pattern 12. In addition, when the barrier pattern 13 is interposed between the hole source pattern 11 and the electron source pattern 12, which are adjacent to each other, each of the channel layers 18 may be in common contact with the hole source pattern 11, the barrier pattern 13, and the electron source pattern 12, which are consecutively arranged.

According to the structure described above, each of the channel layers 18 is in common contact with the hole source pattern 11 and the electron source pattern 12, thus ensuring a current path and a hole supply path. Further, since the hole source patterns 11 and the electron source patterns 12 are alternately arranged, each of the channel layer 18 can be in common contact with the hole source pattern 11 and the electron source pattern 12 even when the channel structure CH is misaligned.

Furthermore, since the barrier patterns 13 are interposed between the hole source patterns 11 and the electron source patterns 12, it is possible to prevent impurities included in the hole source patterns 11 and impurities included in the electron source patterns 12 from being diffused into each other. In addition, the current path and the hole supply path can be electrically isolated from each other.

FIG. 1C is a sectional view illustrating a structure of the semiconductor device, in which an interconnection structure 24 and a peripheral circuit are located under a memory cell array. In FIG. 1C, a hole supply path and a current path are indicated by arrows.

Referring to FIG. 1C, the connection layer 14 may be connected to the interconnection structure 24, and memory strings may be connected to the peripheral circuit through the first substrate 10, the connection layer 14, and the interconnection structure 24. For example, a second substrate 20 may be located under the first substrate 10, and an interlayer insulating layer 25 may be interposed between the first substrate 10 and the second substrate 20. In addition, the peripheral circuit including a transistor, a resistor, and the like and the interconnection structure 24 may be located over the second substrate 20. Here, the transistor may include a gate electrode 21, a gate insulating layer 22, and a junction 23. In addition, the interconnection structure 24 may include lines of multi-levels and contact plugs that electrically connect lines of different levels.

In an erase operation, an erase bias may be applied through the connection layer 14. When the erase bias is transferred to the hole source patterns 11, holes are transferred from the hole source patterns 11 to the channel layers 18. Thus, a sufficient quantity of holes can be supplied.

In a read operation, electrons are supplied from the electron source patterns 12 to the channel layers 18, and a current path is formed via the channel layer 18, the electron source patterns 12, and the interconnection structure 24. Thus, current flows to the interconnection structure 24 through the electron source patterns 12 and the connection line 14 from a selected channel layer 18 among the channel layers 18.

Figure 2A:
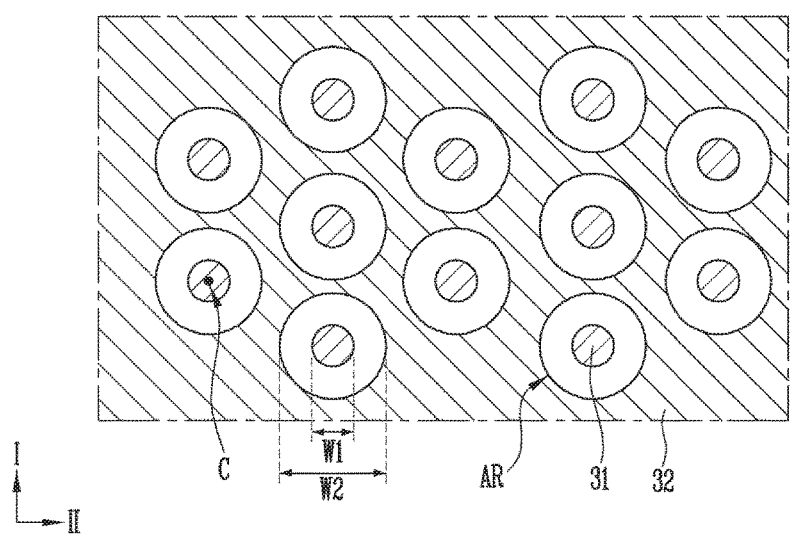
Figure 2C:
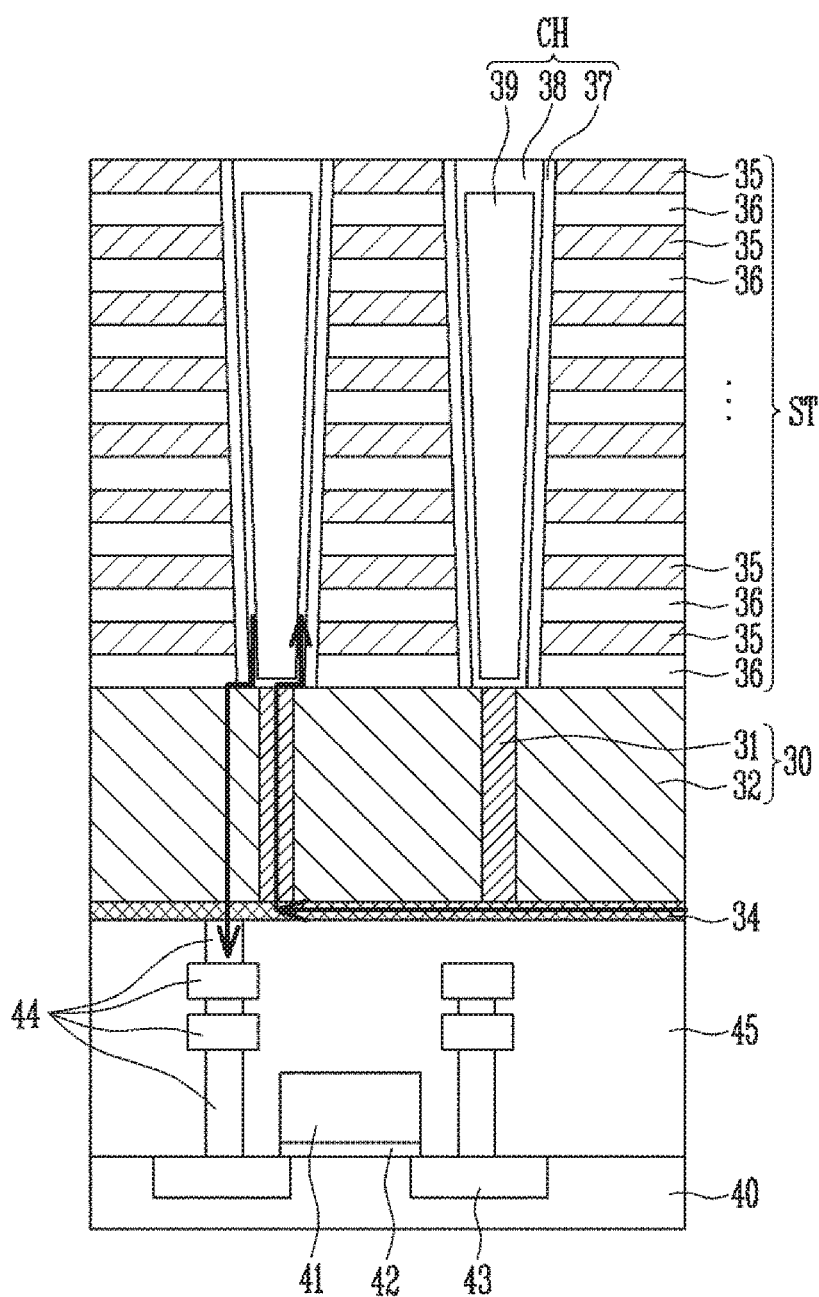

FIGS. 2A and 2B are views illustrating a structure of a semiconductor device in accordance with an embodiment of the present disclosure. FIG. 2A is a layout, and FIGS. 2B and 2C are sectional views. Hereinafter, descriptions and contents overlapping with those of the above-described embodiment will be omitted.

Referring to FIGS. 2A and 2B, the semiconductor device according to the embodiment of the present disclosure may include hole source patterns 31, electron source patterns 32, a stack structure ST, a channel structure CH, and a connection layer 34. Although not shown in the drawings, as described with reference to FIGS. 1A to 1C, barrier patterns may be interposed between the hole source patterns 31 and the electron source patterns 32.

The hole source patterns 31 may include an impurity of a first type, and the electron source patterns 32 may include an impurity of a second type different from the first type. For example, the hole source patterns 31 may include a P-type impurity, and the electron source patterns 32 may include an N-type impurity.

Here, the hole source patterns 31 may have an island shape, and be arranged in a spaced apart relationship in a first direction I and a second direction II intersecting the first direction I. Also, the hole source patterns 31 may be arranged in a staggered form in which their centers are dislocated in the first direction I or the second direction II. Each of the hole source patterns 31 may have a section having various shapes such as a circular shape, an elliptical shape, a quadrangular shape, and a polygonal shape.

The electron source patterns 32 may be formed to fill the space between the hole source patterns 31 adjacent to each other. The electron source patterns 32 may be connected to each other. That is, as illustrated in FIG. 2A, a plurality of hole source patterns 31 may be distributed within a single, continuous electron source pattern 32. In this case, the electron source pattern 32 is located between the adjacent hole source patterns 31, and hence the hole source patterns 31 and the electron source patterns 32 are alternately arranged on a section in the first direction I or the second direction II.

In addition, the hole source patterns 31 and the electron source patterns 32 are located at the same level, to constitute one first substrate 30. Here, the hole source patterns 31 and the electron source patterns 32 may be layers formed through separate processes. In this case, an interface between the hole source patterns 31 and the electron source patterns 32 may exist. Alternatively, the hole source patterns 31 and the electron source patterns 32 may be formed as one layer, and may each be defined as a region doped with an impurity.

The connection layer 34 is located under the hole source patterns 31 and the electron source patterns 32, and is in common contact with the hole source patterns 31 and the electron source patterns 32. For example, the connection layer 34 may be a conductive layer made of or including poly-silicon, metal, and the like.

The stack structure ST may include first material layers 35 and second material layers 36, which are alternately stacked. Here, the first material layers 35 may be conductive layers, and the second material layer 36 may be insulating layers. The channel structures CH may penetrate the stack structure ST. Each of the channel structures CH may include a memory layer 37, a channel layer 38, and a gap-fill layer 39.

Each of the channel layers 38 is in common contact with the hole source pattern 31 and the electron source pattern 32, which are adjacent to each other. A connection region AR shown in FIG. 2A shows a section in which the channel layer 38 is in contact with the hole source pattern 31 and the electron source pattern 32, and it can be seen that a bottom surface of the channel layer 38 is in common contact with the hole source pattern 31 and the electron source pattern 32. Here, the width W1 of the hole source pattern 31 may be narrower than that W2 of the connection region AR. In addition, the center of the hole source pattern 31 and the center C of the connection region AR may correspond to each other or be offset.

According to the structure described above, since the island-shaped hole source patterns 31 are distributed and disposed in the electron source pattern 32, each of the channel layer 38 can be in common contact with the hole source pattern 31 and the electron source pattern 32 even when the channel structure CH is misaligned.

FIG. 2C is a sectional view illustrating a structure of the semiconductor device, in which an interconnection structure 44 and a peripheral circuit are located under a memory cell array. In FIG. 2C, a hole supply path and a current path are indicated by arrows.

Referring to FIG. 2C, the connection layer 34 may be connected to the interconnection structure 44, and memory strings may be connected to the peripheral circuit through the first substrate 30, the connection layer 34, and the interconnection structure 44. For example, a second substrate 40 may be located under the first substrate 30, and an interlayer insulating layer 45 may be interposed between the first substrate 30 and the second substrate 40. In addition, the peripheral circuit including a transistor, a resistor, and the like and the interconnection structure 44 may be located over the second substrate 40. Here, the transistor may include a gate electrode 41, a gate insulating layer 42, and a junction 43.

In an erase operation, an erase bias may be applied through the connection layer 34. When the erase bias is transferred to the hole source patterns 31, holes are transferred from the hole source patterns 31 to the channel layers 38. Thus, a sufficient quantity of holes can be supplied to the channel layers 38.

In a read operation, electrons are supplied from the electron source patterns 32 to the channel layers 38, and a current path is formed via the channel layer 38, the electron source patterns 32, and the interconnection structure 44. Thus, current flows to the interconnection structure 44 through the electron source patterns 32 and the connection line 34 from a selected channel layer 38 among the channel layers 38.

Figure 3A:
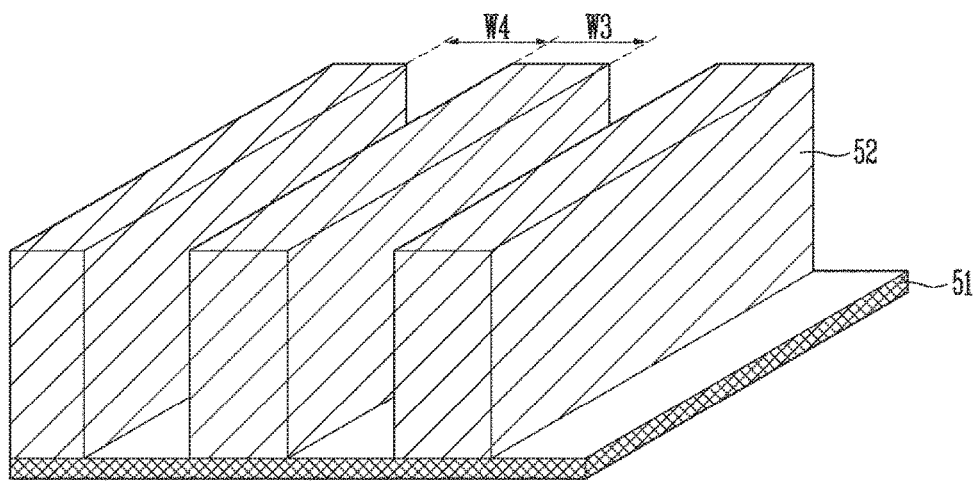
FIGS. 3A to 3C are sectional views illustrating a manufacturing method of a semiconductor device in accordance with an embodiment of the present disclosure.
Figure 3B:
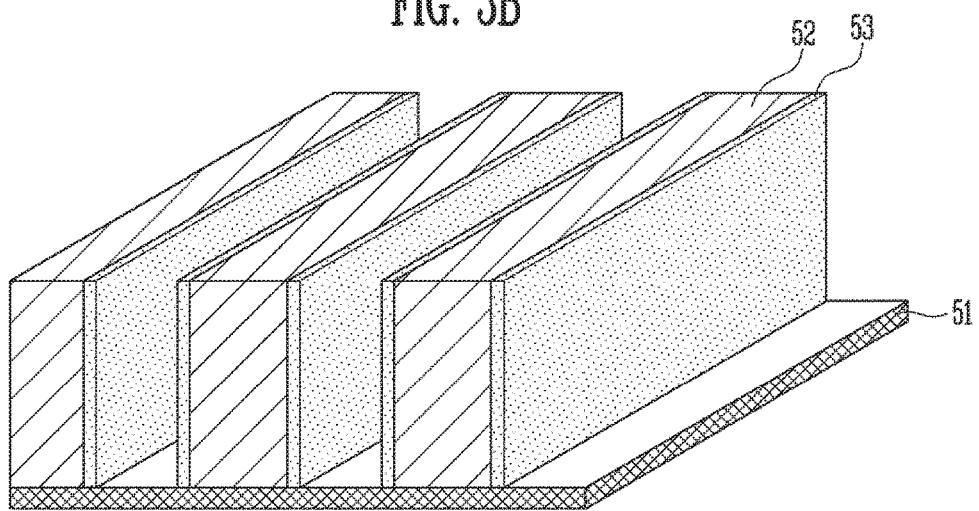
Figure 3C:
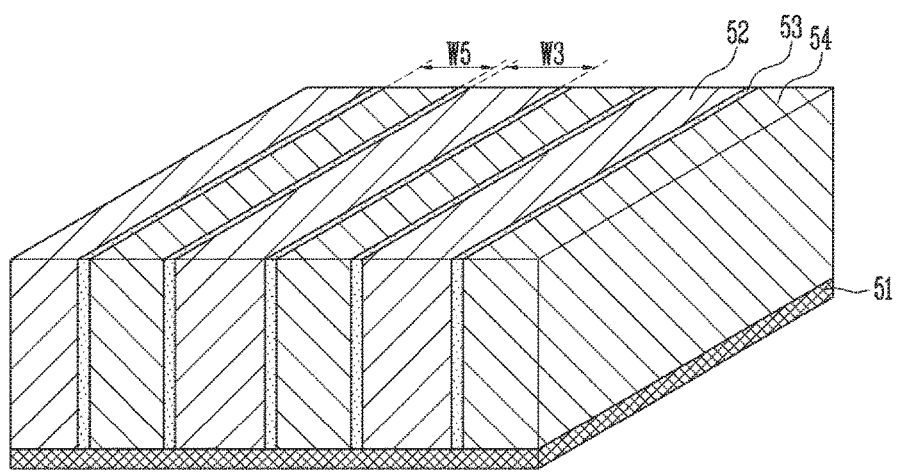

FIGS. 3A to 3C are sectional views illustrating a manufacturing method of a semiconductor device in accordance with an embodiment of the present disclosure. Hereinafter, contents overlapping with those of the above-described embodiments will be omitted.

Referring to FIG. 3A, a connection layer 51 is formed over a lower structure (not shown) including a peripheral circuit, an interconnection structure, and the like. For example, after a peripheral circuit is formed over a substrate, an interlayer insulating layer and an interconnection structure connected to the peripheral circuit by penetrating the interlayer insulating layer is formed over the substrate. Subsequently, the connection layer 51 connected to the interconnection structure is formed. Here, the connection layer 51 may be made of or include a conductive material including poly-silicon, metal, and the like.

Subsequently, hole source patterns 52 are formed over the connection layer 51. For example, a material layer including an impurity of a first type may be formed over the connection layer, and the hole source patterns 52 may be formed by patterning the material layer in a plurality of line shapes spaced apart from each other at a regular interval. The hole source patterns 52 may be formed using any suitable method, such as an etching process, a damascene process, etc. The hole source patterns 52 may be poly-silicon layers including a P-type impurity.

Here, the width W3 of the hole source patterns 52 and the width W4 of a space between adjacent hole source patterns 52 may be equal to or different from each other. In the drawing, it is illustrated that the widths W3 and W5 are substantially equal to each other, but the present disclosure is not limited thereto. For example, by considering the width of barrier patterns to be formed in a subsequent process, the space width W4 may be larger than the width W3 of the hole source patterns 52.

Referring to FIG. 3B, barrier patterns 53 are formed over the exposed sidewalls of the hole source patterns 52. For example, after a barrier layer is formed along the entire surface of a resultant structure in which the hole source patterns 52 are formed, the barrier patterns 53 having a spacer shape are formed by anisotropically etching the barrier layer. Here, the barrier patterns 53 may be made of or include a dielectric material such as oxide or nitride.

In a variation of this embodiment the process of forming the barrier patterns 53 may be omitted. In this case, the hole source patterns 52 and electron source patterns formed in a subsequent process are in direct contact with each other.

Referring to FIG. 3C, electron source patterns 54 are formed between the hole source patterns 52 adjacent to each other. For example, an electron source material layer may be formed over a resultant structure in which the hole source patterns 52 and the barrier patterns 53 are formed. At this time, the electron source material layer may be formed not only between the adjacent hole source patterns 52 but also on top of the hole source patterns 52 and the barrier patterns 53. Subsequently, the electron source material layer may be planarized until upper surfaces of the hole source patterns 52 and the barrier patterns 53 are exposed. For example, the electron source material layer may be planarized using a chemical mechanical polishing (CMP). Accordingly, the electron source patterns 54 are formed.

Here, the width W3 of the hole source patterns 52 and the width W5 of the electron source patterns 54 may be equal to or different from each other. In the drawing, it is illustrated that the hole source patterns 52 have a width wider than that of the electron source patterns 54, but the present disclosure is not limited thereto. The electron source patterns 54 may have a width wider than that of the hole source patterns 52, or have a width substantially equal to that of the hole source patterns 52.

Subsequently, although not shown in the drawing, a process for forming a stack structure and a channel structure penetrating the stack structure may be performed.

According to the manufacturing method described above, the hole source patterns 52 and the electron source patterns 54, which are alternately arranged, can be easily formed. Further, the barrier patterns 53 interposed between the hole source patterns 52 and the electron source pattern 54 can be easily formed.

FIGS. 4A to 4D are perspective views illustrating a manufacturing method of a semiconductor device in accordance with an embodiment of the present disclosure. Hereinafter, contents overlapping with those of the above-described embodiments will be omitted.

Figure 4A:
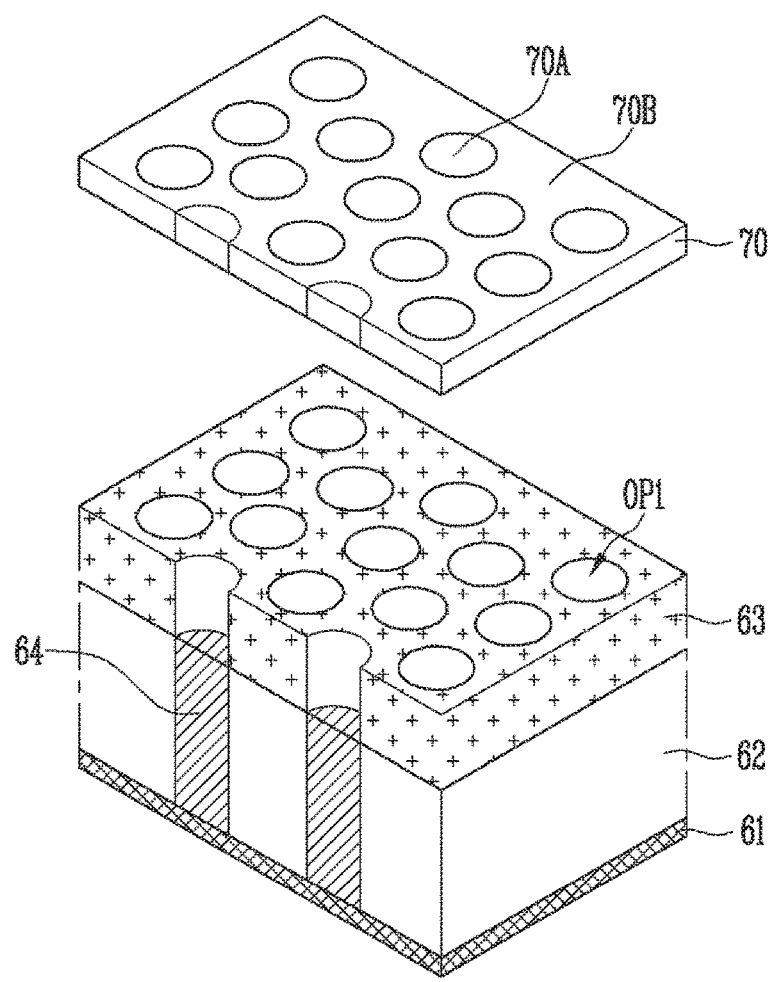
FIGS. 4A to 4D are perspective views illustrating a manufacturing method of a semiconductor device in accordance with an embodiment of the present disclosure.

Referring to FIG. 4A, a connection layer 61 is formed over a lower structure (not shown) including a peripheral circuit and the like. Subsequently, a sacrificial layer 62 is formed over the connection layer 61. Here, the sacrificial layer 62 may be a semiconductor layer including silicon (Si), germanium (Ge), and the like.

Subsequently, a first mask pattern 63 is formed over the sacrificial layer 62, using a mask 70. The mask 70 may be a photomask or a reticle, and include a light blocking part 70A and a light transmission part 70B. For example, the light blocking part 70A may be located to correspond to regions in which openings for channels to be formed in a subsequent process are to be located. For reference, the light blocking part and the light transmission part are relative to each other, and "70A" and "70B" may be the light transmission part and the light blocking part, respectively.

The first mask pattern 63 may be a negative type photoresist pattern. In this case, a negative type photoresist is coated on the sacrificial layer 62 and then exposed using the mask 70. Subsequently, when the photoresist is developed, a region that is not exposed by the mask 70 is removed, and a region that is exposed by the mask 70 remains. Therefore, the first mask pattern 63 having a plurality of first openings OP1 is formed. Here, the first openings OP1 may be located to correspond to regions in which openings for channels to be formed in a subsequent process are to be located. For reference, when "70A" and "70B" may be the light transmission part and the light blocking part, respectively, a positive type photoresist pattern may be used as the first mask pattern 63.

Subsequently, hole source patterns 64 are formed by ion-injecting an impurity of a first type into the sacrificial layer 62, using the first mask pattern 63 as a barrier. In this case, the hole source patterns 64 in contact with the connection layer 61 are formed at positions corresponding to the first openings OP1.

Figure 4B:
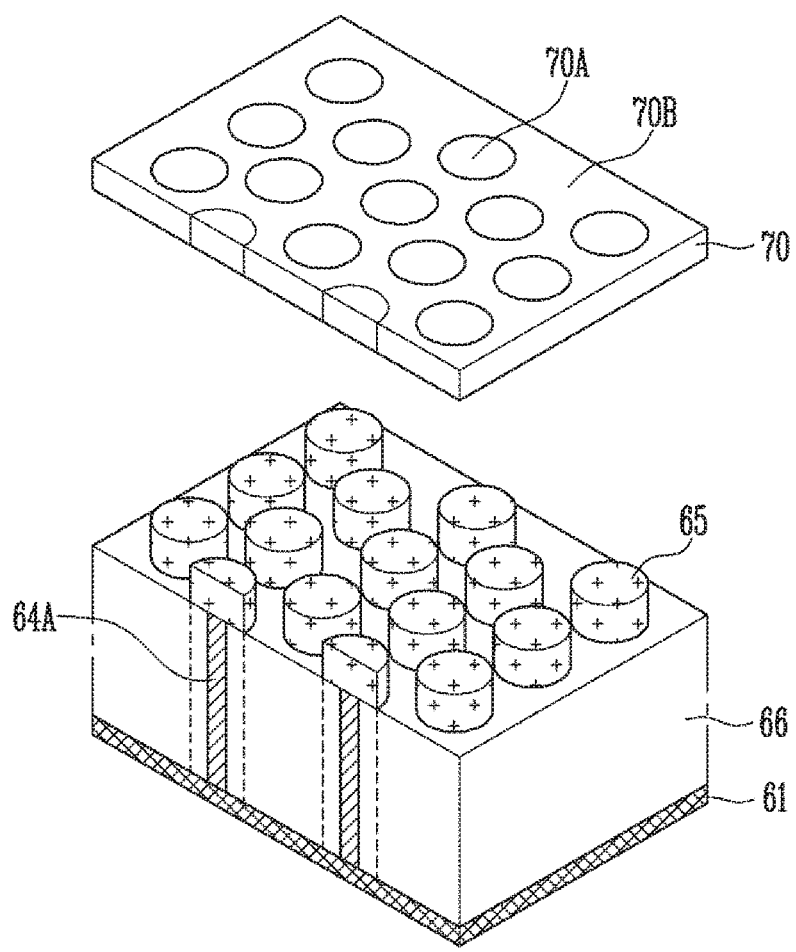

Referring to FIG. 4B, after the first mask pattern 63 is removed, a second mask pattern 65 is formed over the sacrificial layer 62, using the mask 70. The second mask pattern 65 may be a positive type photoresist pattern, and have a reversed shape of the first mask pattern 63. For reference, when "70A" and "70B" may be the light transmission part and the light blocking part, respectively, a positive type photoresist pattern may be used as the first mask pattern 63, and a negative type photoresist pattern may be used as the second mask pattern 65.

For example, a positive type photoresist is coated on the sacrificial layer 62 and then exposed using the mask 70. Subsequently, when the photoresist is developed, a region that is exposed by the mask 70 is removed, and a region that is not exposed by the mask 70 remains. Therefore, the second mask pattern 65 including island-shaped patterns is formed. Here, the island-shaped patterns may be located to correspond to regions in which openings for channels to be formed in a subsequent process are to be located.

Subsequently, electron source patterns 66 are formed by ion-injecting an impurity of a second type into the sacrificial layer 62, using the second mask pattern 65 as a barrier. At this time, the width of previously formed hole source patterns 64A may be decreased by controlling ion injection conditions of the impurity of the second type. For example, if the concentration of the impurity of the second type is increased, the width of the previously formed hole source patterns 64A may be decreased.

Figure 4C:
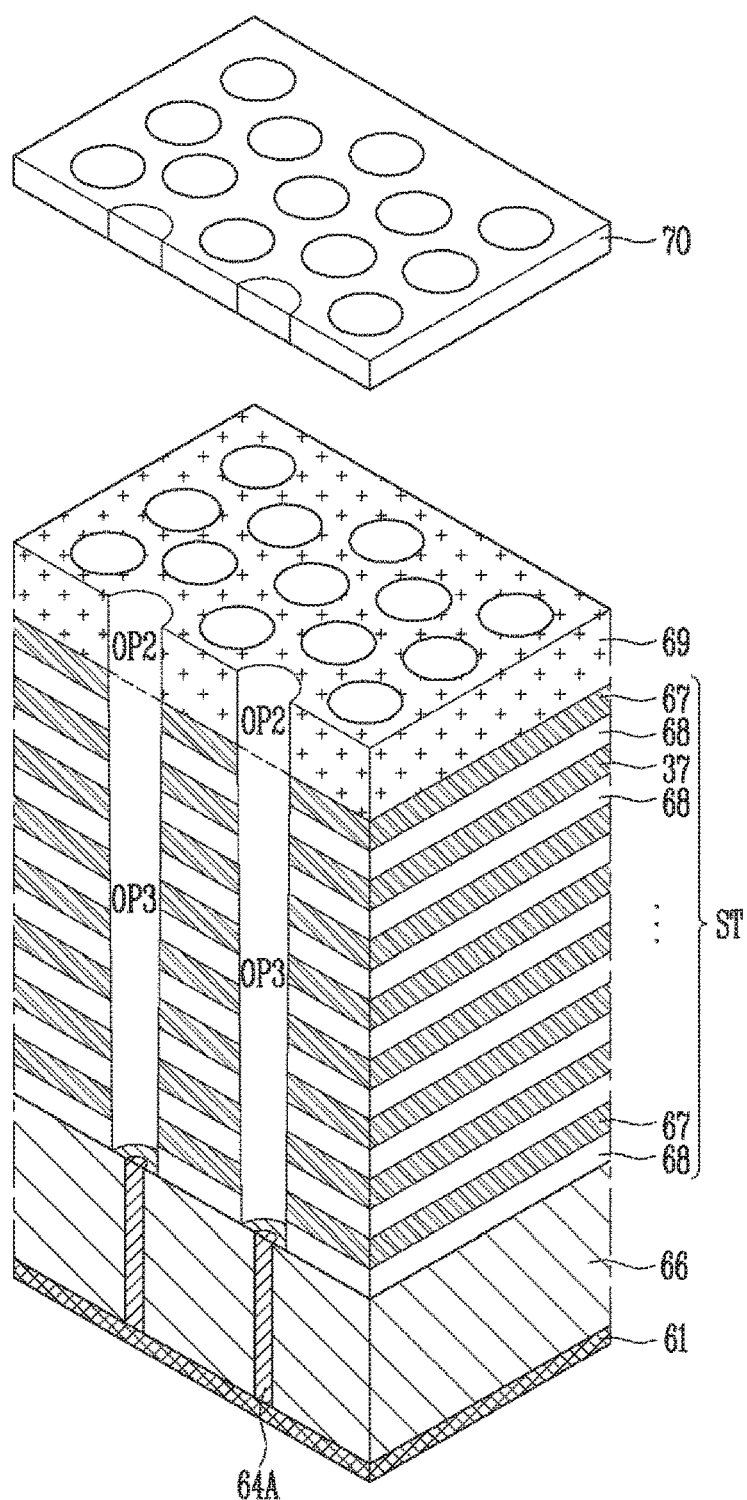

Referring to FIG. 4C, a stack structure ST is formed over the hole source patterns 64A and the electron source patterns 66. For example, the stack structure ST is formed by alternately stacking first material layers 67 and second material layers 68. Here, the first material layers 67 may be used to form gate electrodes of memory cells, select transistors, and the like, and the second material layers 68 may be used to insulate the stacked gate electrodes from each other.

The first material layers 67 are formed of a material having an etching selection ratio higher than that of the second material layers 68. As an example, the first material layers 67 may be sacrificial layers including nitride, etc., and the second material layers 68 may be insulating layers including oxide, etc. As another example, the first material layers 67 may be conductive layers made of or including poly-silicon, tungsten, etc., and the second material layers 68 may be insulating layers made of or including oxide, etc. As still another example, the first material layers 67 may be conductive layers including doped poly-silicon, etc., and the second material layers 68 may be sacrificial layers including undoped poly-silicon, etc.

Subsequently, a third mask pattern 69 is formed over the stack structure ST, using the mask 70. The third mask pattern 69 may be a negative type photoresist pattern, and have a shape substantially equal to the first mask pattern 63. For reference, when "70A" and "70B" are the light transmission part and the light blocking part, respectively, a positive type photoresist pattern may be used as the first mask pattern 63 and the third mask pattern 69, and a negative type photoresist pattern may be used as the second mask pattern 65.

For example, a negative type photoresist is coated on the stack structure ST and then exposed using the mask 70. Subsequently, if the photoresist is developed, a region that is not exposed by the mask 70 is removed, and a region that is exposed by the mask 70 remains. Accordingly, the third mask pattern 69 having a reversed shape of the second mask pattern 65 can be formed.

Subsequently, third openings OP3 are formed by etching the stack structure ST, using the third mask pattern 69 as an etching barrier. Here, each of the third openings P3 commonly expose the hole source pattern 64A and the electron source pattern 66 therethrough.

Figure 4D:
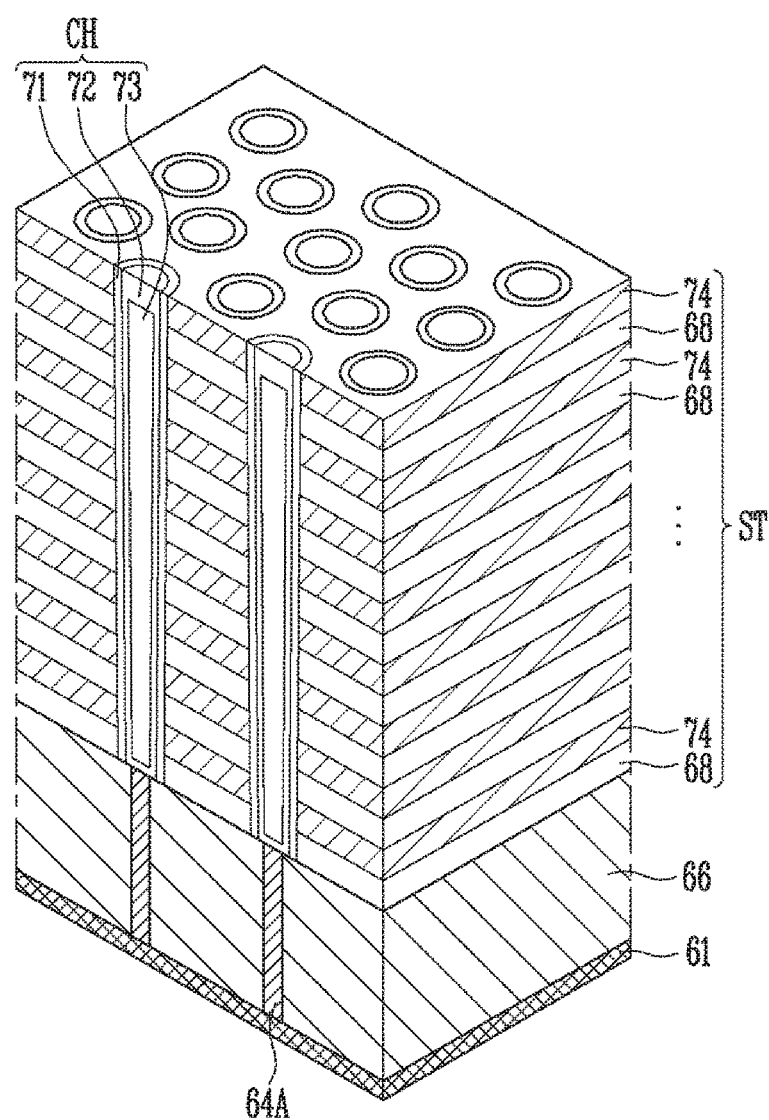

Referring to FIG. 4D, channel structures CH are formed in the third openings OP3, respectively. For example, a memory layer 73, a channel layer 72, and a gap-fill layer 71 are formed in each of the third openings OP3. Accordingly, the channel layer 72 is formed, which is in common contact with the hole source pattern 64A and the electron source pattern 66.

Subsequently, an additional process may be performed according to materials of the first material layers 67 and the second material layer 68. As an example, when the first material layers 67 are sacrificial layers and the second material layers 68 are insulating layers, the first material layers 67 are replaced with conductive layers 74. As another example, when the first material layers 67 are conductive layers and the second material layers 68 are insulating layers, the first material layers 67 are silicided. As still another example, when the first material layers 67 are conductive layers and the second material layers 68 are sacrificial layers, the second material layers 68 are replaced with insulating layers.

According to the manufacturing method described above, the hole source patterns 64A, the electron source patterns 66, and the third openings OP3 can be formed using one mask 70. In other words, the hole source patterns 64A and the electron source patterns 66 are formed using a mask for forming the third openings OP3, so that the hole source patterns 64A and the electron source patterns 66 can be formed without any additional mask.

Figure 5:
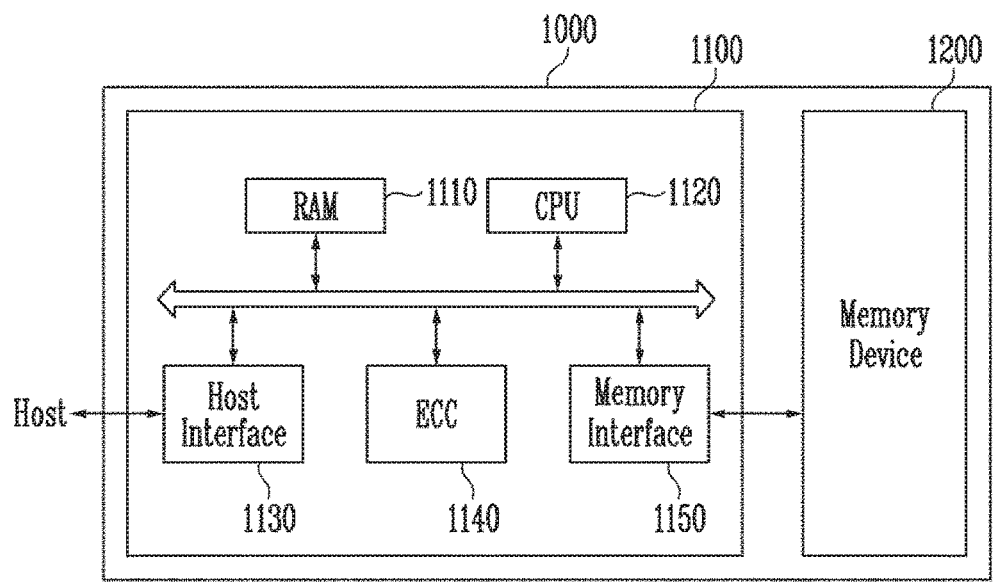
FIGS. 5 and 6 are block diagrams illustrating configurations of memory systems in accordance with various embodiments of the present disclosure.

FIG. 5 is a block diagram illustrating a configuration of a memory system 1000 in accordance with an embodiment of the present disclosure.

Referring to FIG. 5, the memory system 1000 includes a memory device 1200 and a controller 1100.

The memory device 1200 is used to store data information having various data formats such as texts, graphics, and software codes. The memory device 1200 may be a nonvolatile memory. Also, the memory device 1200 may have the structures described with reference to FIGS. 1A to 4D, and be manufactured according to the manufacturing methods described with reference to FIGS. 1A to 4D. In an embodiment, the memory device 1200 may include: hole source patterns; electron source patterns located between adjacent hole source patterns; a stack structure over the hole source patterns and the electron source patterns; and channel layers penetrating the stack structure, the channel layers being in common contact with at least one hole source pattern among the hole source patterns and at least one electron source pattern among the electron source patterns, wherein holes are supplied from the hole source patterns to the channel layers in an erase operation, and electrons are supplied from the electron source patterns to the channel layers in a read operation. The structure and manufacturing method of the memory device 1200 are the same as described above, and therefore, their detailed descriptions will be omitted.

The controller 1100 is connected to a host and the memory device 1200, and is configured to access the memory device 1200 in response to a request from the host. For example, the controller 1100 is configured to control reading, writing, erasing, and background operations of the memory device 1200.

The controller 1100 includes a random-access memory (RAM) 1110, a central processing unit (CPU) 1120, a host interface 1130, an error correction code (ECC) circuit 1140, a memory interface 1150, and the like.

Here, the RAM 1110 may be used as an operation memory of the CPU 1120, a cache memory between the memory device 1200 and the host, and a buffer memory between the memory device 1200 and the host. For reference, the RAM 1110 may be replaced with a static random-access memory (SRAM), a read only memory (ROM), etc.

The CPU 1120 is configured to control the overall operations of the controller 1100. For example, the CPU 1120 is configured to operate firmware such as a flash translation layer (FTL) stored in the RAM 1110.

The host interface 1130 is configured to interface with the host. For example, the controller 1100 may communicate with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 is configured to detect and correct an error included in data that is read from the memory device 1200, using an error correction code (ECC).

The memory interface 1150 may be configured to interface with the memory device 1200. For example, the memory interface 1150 may include a NAND interface or NOR interface.

For reference, the controller 1100 may further include a buffer memory (not shown) for temporarily storing data.

Here, the buffer memory may be used to temporarily store data transferred to the outside through the host interface 1130 or data transferred from the memory device 1200 through the memory interface 1150. The controller 1100 may further include a ROM that stores code data for interfacing with the host.

As described above, the memory system 1000 according to the embodiment of the present disclosure includes the memory device 1200 having an improved degree of integration and improved characteristics, and thus it is possible to improve the degree of integration and characteristics of the memory system 1000.

Figure 6:
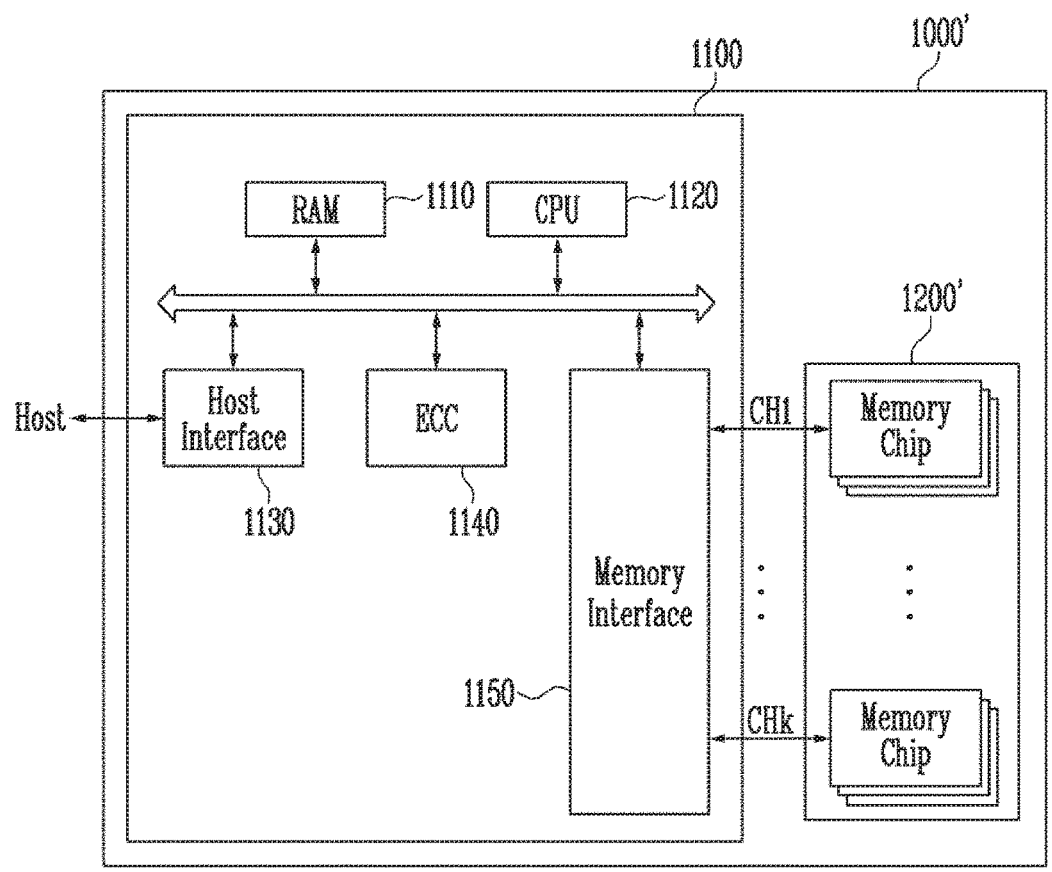

FIG. 6 is a block diagram illustrating a configuration of a memory system 1000', according to another embodiment of the present disclosure. Hereinafter, descriptions of contents overlapping with those described above will be omitted.

Referring to FIG. 6, the memory system 1000' may include a memory device 1200' and a controller 1100. The controller 1100 includes a RAM 1110, a CPU 1120, a host interface 1130, an ECC circuit 1140, a memory interface 1150, and the like.

The memory device 1200' may be a nonvolatile memory. Also, the memory device 1200' may have the structures described with reference to FIGS. 1A to 4D, and be manufactured according to the manufacturing methods described with reference to FIGS. 1A to 4D. In an embodiment, the memory device 1200' may include: hole source patterns; electron source patterns located between adjacent hole source patterns; a stack structure over the hole source patterns and the electron source patterns; and channel layers penetrating the stack structure, the channel layers being in common contact with at least one hole source pattern among the hole source patterns and at least one electron source pattern among the electron source patterns, wherein holes are supplied from the hole source patterns to the channel layers in an erase operation, and electrons are supplied from the electron source patterns to the channel layers in a read operation. The structure and manufacturing method of the memory device 1200' are the same as described above, and therefore, their detailed descriptions will be omitted.

The memory device 1200' may be a multi-chip package including a plurality of memory chips. The plurality of memory chips are divided into a plurality of groups, which are configured to communicate with the controller 1100 over first to kth channels (CH1 to CHk). In addition, memory chips included in one group may be configured to communicate with the controller 1100 over a common channel. For reference, the memory system 1000' may be modified such that one memory chip is connected to one channel.

As described above, the memory system 1000' according to the embodiment of the present disclosure includes the memory device 1200' having an improved degree of integration and improved characteristics, and thus it is possible to improve the degree of integration and characteristics of the memory system 1000'. Particularly, the memory device 1200' is configured as a multi-chip package, so that it is possible to increase the data storage capacity of the memory system 1000' and to improve the operation speed of the memory system 1000'.

Figure 7:
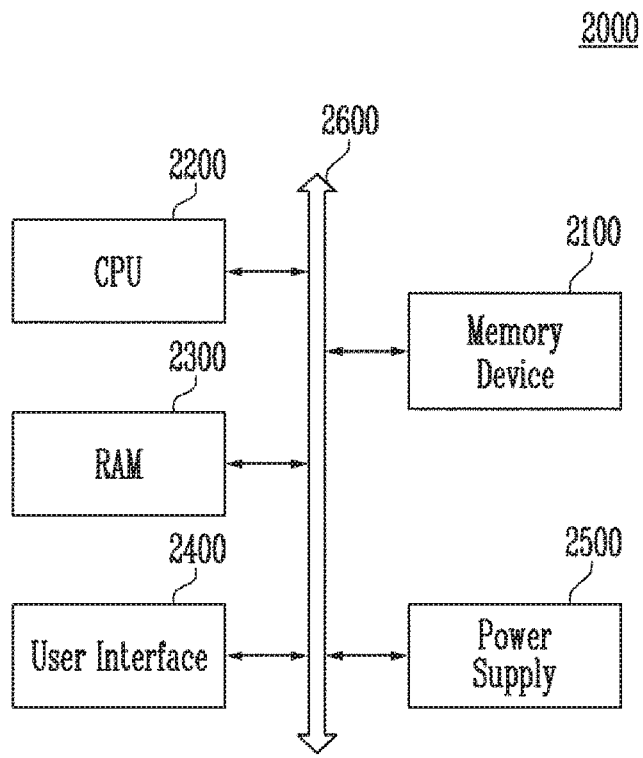
FIGS. 7 and 8 are block diagrams illustrating configurations of computing systems in accordance with various embodiments of the present disclosure.

FIG. 7 is a block diagram illustrating a configuration of a computing system according to an embodiment of the present disclosure. Hereinafter, description of contents overlapping with those described above will be omitted.

Referring to FIG. 7, the computing system 2000 according to the embodiment of the present disclosure includes a memory device 2100, a CPU 2200, a RAM 2300, a user interface 2400, a power source 2500, a system bus 2600, and the like.

The memory device 2100 stores data provided through the user interface 2400, data processed by the CPU 2200, and the like. In addition, the memory device 2100 is electrically connected to the CPU 2200, the RAM 2300, the user interface 2400, the power supply 2500, and the like through the system bus 2600. For example, the memory device 2100 may be connected to the system bus 2600 through a controller (not shown) or directly. When the memory device 2100 is directly connected to the system bus 2600, a function of the controller may be performed by the CPU 2200, the RAM 2300, etc.

The memory device 2100 may be a nonvolatile memory. Also, the memory device 2100 may have the structures described with reference to FIGS. 1A to 4D, and be manufactured according to the manufacturing methods described with reference to FIGS. 1A to 4D. In an embodiment, the memory device 2100 may include: hole source patterns; electron source patterns located between adjacent hole source patterns; a stack structure over the hole source patterns and the electron source patterns; and channel layers penetrating the stack structure, the channel layers being in common contact with at least one hole source pattern among the hole source patterns and at least one electron source pattern among the electron source patterns, wherein holes are supplied from the hole source patterns to the channel layers in an erase operation, and electrons are supplied from the electron source patterns to the channel layers in a read operation. The structure and manufacturing method of the memory device 2100 are the same as described above, and therefore, their detailed descriptions will be omitted.

The memory device 2100 may be a multi-chip package including a plurality of memory chips as described with reference to FIG. 8.

The computing system 2000 configured as described above may be a computer, an ultra-mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, etc.

As described above, the computing system 2000 according to an embodiment of the present disclosure includes the memory device 2100 having an improved degree of integration and improved characteristics, and thus it is possible to improve the degree of integration and characteristics of the computing system 2000.

Figure 8:
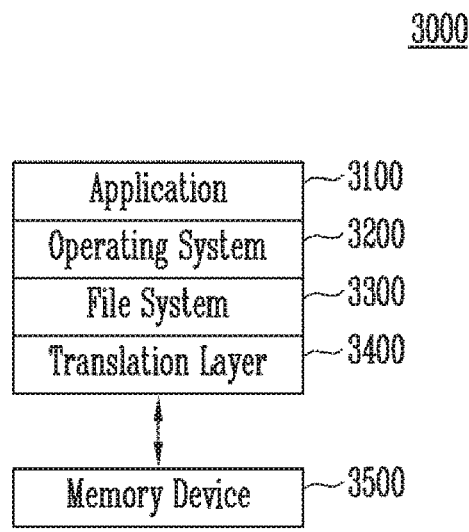

FIG. 8 is a block diagram illustrating a computing system 3000 in accordance with an embodiment of the present disclosure.

Referring to FIG. 8, the computing system 3000 includes a software layer including an operating system 3200, an application 3100, a file system 3300, a translation layer 3400, and the like. In addition, the computing system 3000 includes a hardware layer of a memory device 3500.

The operating system 3200 may manage software resources, hardware resources, etc. of the computing system 3000, and control program execution of a central processing unit. The application 3100 is one of a variety of application programs running on the computing system 3000, and may be a utility executed by the operating system 3200.

The file system 3300 means a logical structure for managing data, files, etc. in the computing system 3000, and organizes the data or files stored in the memory device 3500 according to a rule. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

In this drawing, the operating system 3200, the application 3100, and the file system 3300 are shown as individual blocks. However, the application 3100 and the file system 3300 may be included in the operating system 3200.

The translation layer 3400 translates an address into a form suitable for the memory device 3500 in response to a request from the file system 3300. For example, the translation layer 3400 may translate a logical address generated by the file system 3300 into a physical address of the memory device 3500. Mapping information between the logical address and the physical address may be stored as an address translation table. For example, the translation layer 3400 may be a flash translation layer (FTL), a universal flash storage link layer (ULL), and the like.

The memory device 3500 may be a nonvolatile memory. Also, the memory device 3500 may have the structures described with reference to FIGS. 1A to 4D, and be manufactured according to the manufacturing methods described with reference to FIGS. 1A to 4D. In an embodiment, the memory device 3500 may include: hole source patterns; electron source patterns located between adjacent hole source patterns; a stack structure over the hole source patterns and the electron source patterns; and channel layers penetrating the stack structure, the channel layers being in common contact with at least one hole source pattern among the hole source patterns and at least one electron source pattern among the electron source patterns, wherein holes are supplied from the hole source patterns to the channel layers in an erase operation, and electrons are supplied from the electron source patterns to the channel layers in a read operation. The structure and manufacturing method of the memory device 3500 are the same as described above, and therefore, their detailed descriptions will be omitted.

The computing system 3000 configured as described above may be divided into an operating system layer performed in an upper level region and a controller layer performed in a lower level region. Here, the application 3100, the operating system 3200, and the file system 3300 are included in the operating system layer, and may be driven by the operation memory of the computing system 3000. In addition, the translation layer 3400 may be included in the operating system layer or the controller layer.

As described above, the computing system 3000 according to the embodiment of the present disclosure includes the memory device 3500 having an improved degree of integration and improved characteristics, and thus it is possible to improve the degree of integration and characteristics of the computing system 3000.

According to the present disclosure, it is possible to provide a semiconductor device having a stable structure and improved reliability. Also, in manufacturing of the semiconductor device, the level of difficulty of processes can be lowered, a manufacturing procedure can be simplified, and manufacturing cost can be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising:
hole source patterns;
electron source patterns located between adjacent hole source patterns;
a stack structure over the hole source patterns and the electron source patterns; and
channel layers penetrating the stack structure,
wherein each channel layer is in contact with a corresponding hole source pattern and an electron source pattern adjacent to the corresponding hole source pattern.

2. The semiconductor device of claim 1, wherein holes are supplied from the hole source patterns to the channel layers in an erase operation, and electrons are supplied from the electron source patterns to the channel layers in a read operation.

3. The semiconductor device of claim 1, wherein the hole source patterns include an impurity of a first type, and the electron source patterns include an impurity of a second type different from the first type.

4. The semiconductor device of claim 1, wherein the hole source patterns are poly-silicon layers including a P-type impurity, and the electron source patterns are poly-silicon layers including an N-type impurity.

5. The semiconductor device of claim 1, further comprising barrier patterns interposed between the hole source patterns and the electron source patterns for electrically isolating the hole source patterns and the electron source patterns from each other.

6. The semiconductor device of claim 1, wherein the hole source patterns and the electron source patterns have line shapes extending in a first direction.

7. The semiconductor device of claim 6, further comprising barrier patterns interposed between the hole source patterns and the electron source patterns, the barrier patterns having a line shape extending in the first direction.

8. The semiconductor device of claim 1,
wherein the hole source patterns are arranged in an island shape, and the electron source patterns fill the space between the adjacent hole source patterns and are connected to each other.

9. The semiconductor device of claim 8, wherein each of the hole source patterns has a width narrower than each of the channel layers.

10. The semiconductor device of claim 9, wherein each of the hole source patterns is positioned substantially centrally below the channel layer.

11. The semiconductor device of claim 1, further comprising:

a connection layer in common contact with the hole source patterns and the electron source patterns; and
an interconnection structure located under the connection layer, wherein, in an erase operation, an erase bias is applied to the hole source patterns through the connection layer.

12. The semiconductor device of claim 1, further comprising:
a connection layer in common contact with the hole source patterns and the electron source patterns; and
an interconnection structure located under the connection layer,
wherein, in a read operation, current flows to the interconnection structure through the electron source patterns and the connection layer from a selected channel layer among the channel layers.

13. A semiconductor device comprising:
hole source patterns and electron source patterns alternately arranged;
a stack structure formed over the hole source patterns and the electron source patterns; and
channel layers penetrating the stack structure, each channel layer being in common contact with a hole source pattern and an electron source pattern adjacent to the hole source pattern,
wherein holes are supplied from the hole source patterns to the channel layers in an erase operation, and current flows to the electron source patterns from a selected channel layer among the channel layers in a read operation.

14. The semiconductor device of claim 13, further comprising barrier patterns interposed between the hole source patterns and the electron source patterns.

15. The semiconductor device of claim 13, further comprising:
a connection layer in common contact with the hole source patterns and the electron source patterns; and
an interconnection structure located under the connection layer,
wherein in the erase operation an erase bias is applied through the connection layer.

16. The semiconductor device of claim 13, further comprising:
a connection layer in common contact with the hole source patterns and the electron source patterns; and
an interconnection structure located under the connection layer,
wherein in the read operation current flows to the interconnection structure through the electron source patterns and the connection layer from the channel layers.

17. A semiconductor device comprising:
a stack structure formed of a plurality of insulating and conductive layers alternately stacked along a third direction vertical to a plane defined by a first and a second direction, each insulating layer and each conductive layer extending in the first and the second direction,
hole source patterns and electron source patterns alternately formed along the second direction; and
channel layers penetrating the stack structure to expose and contact the hole source patterns and the electron source patterns,
wherein each channel layer is in contact with a corresponding hole source pattern and two electron source patterns that are adjacent on either side of the hole source pattern, and wherein each hole source pattern is electrically isolated from adjacent electron source patterns via a barrier pattern.

18. The semiconductor device of claim 17, further comprising:
- a connection layer including a conductive material and positioned below the alternating hole source patterns and electron source patterns;
- an interlayer insulating layer positioned below the connection layer;
- a second substrate;
- an interconnection structure formed within the interlayer insulating layer; and
- at least one transistor formed at least partially over the second substrate and comprising a gate insulating layer, junction regions and a gate electrode,
- wherein the connection layer is electrically coupled to the transistor through the interconnection structure.

19. The semiconductor device of claim 17, wherein the semiconductor device is a NAND flash memory device.

* * * * *